United States Patent [19]
Chen

[11] Patent Number: 6,097,244
[45] Date of Patent: Aug. 1, 2000

[54] HIGHLY-LINEAR CONTINUOUS-TIME FILTER FOR A 3-VOLT SUPPLY WITH PLL-CONTROLLED RESISTOR AND DIGITALLY-CONTROLLED CAPACITOR

[75] Inventor: Xiaole Chen, Milpitas, Calif.

[73] Assignee: Centillium Communications, Inc., Fremont, Calif.

[21] Appl. No.: 09/215,508

[22] Filed: Dec. 17, 1998

[51] Int. Cl.[7] .................................................. H04B 1/10
[52] U.S. Cl. .......................... 327/553; 327/552; 327/308; 327/558; 327/557; 327/556
[58] Field of Search .................................. 327/308, 552, 327/553, 362; 330/305, 303

[56] References Cited

U.S. PATENT DOCUMENTS

| | | | |
|---|---|---|---|
| 3,772,617 | 11/1973 | Ciesielka | 333/18 |
| 4,626,808 | 12/1986 | Nossek | 333/173 |
| 4,918,338 | 4/1990 | Wong | 327/553 |
| 5,262,779 | 11/1993 | Sauer | 341/161 |
| 5,345,119 | 9/1994 | Khoury | 307/521 |
| 5,492,935 | 2/1996 | Okanobu | 327/553 |
| 5,608,665 | 3/1997 | Wyszynski | 364/825 |
| 5,729,230 | 3/1998 | Jensen et al. | 341/143 |

OTHER PUBLICATIONS

Banu, M and Tsividis, Y., "An Elliptic Continuous–Time CMOS Filter with On–Chip Automatic Tuning" IEEE JSSC vol. SC–20, No. 6, pp 1114–21, Dec. 1985.

Moon and Song, "Design of a Low–Distortion 22–KHz Fifth–Order Bessel Filter" IEEE JSSC vol. 28, No. 12, pp 1254–64, Dec. 1993.

Durham and Redman–White, "Integrated Continuous–Time Balanced Filters for 16–b DSP Interfaces" IEEE JSSC vol. 28, No. 7, pp 835–39, Jul. 1993.

*Primary Examiner*—Tuan T. Lam
*Assistant Examiner*—Hiep Nguyen
*Attorney, Agent, or Firm*—Stuart T. Auvinen

[57] ABSTRACT

A continuous-time filter is highly linear even when used with reduced 3-volt power supplies. In each stage of a multi-stage ladder network, resistor networks are attached to each input of a differential op amp. Each resistor network uses fixed resistors in series between the inputs and an intermediate node, and a fixed input resistor between the intermediate node and the op-amp input. The fixed input resistor improves linearity compared with a linear transistor. A transistor connects the internal node to ground, acting as a variable resistor to adjust the equivalent resistance of the resistor network. A control voltage applied to the gate of the transistor is generated by an analog control loop. The control voltage is the voltage input to a voltage-controlled oscillator (VCO) in a phase-locked loop (PLL). The analog PLL control loop adjusts the control voltage and the resistance continuously as the filter operates. A voltage comparator detects when the control voltage is out of a range, activating a calibration signal. Filtering stops and a digital successive-approximation register adjusts capacitances of feedback capacitors around the op amps. The capacitance in the VCO is also adjusted, changing the control voltage. Capacitance converges to the desired value by comparing the control voltage to a mid-range target voltage.

18 Claims, 6 Drawing Sheets

HIGHLY-LINEAR CONTINUOUS-TIME FILTER FOR A 3-VOLT SUPPLY WITH PLL-CONTROLLED RESISTOR AND DIGITALLY-CONTROLLED CAPACITOR

FIELD OF THE INVENTION

This invention relates to filter circuits, and more particularly for highly-linear continuous-time filters for 3-volt power supplies.

BACKGROUND OF THE INVENTION

Telecommunications and other applications require highly-linear filter circuits. Distortion must be kept to a minimum. This is a challenge since low-cost manufacturing demands the use of semiconductor technologies such as complementary metal-oxide-semiconductor (CMOS) integrated circuit. MOS transistors often replace resistors in these filters.

Some applications require that the filter operate and be trimmed or adjusted continuously. Variable resistors can be used in resistor networks in the filters. As line conditions, temperature, or power-supply fluctuation occur, the variable resistor can be adjusted to compensate while the filter is still operating. These filters operate on a continuos-time input and are thus known as continuous-time filters.

Capacitors can also be adjusted to provide a wider range of compensation. However, the filter must usually be halted while the capacitance is adjusted. Thus resistor tuning is preferred.

Highly-linear filters can be constructed from MOS transistors that are biased in the linear region. However, if drain voltage changes are too great, the MOS transistors may drift out of the linear region and into the saturated region. Distortion then occurs since small drain-to-source voltage changes no longer change the transistor's channel current linearly. The transistor ceases to behave as a linear resistor.

The trend towards reduced power-supply voltages exasperates this problem. For example, replacing a 5-volt power supply with a 3-volt supply reduces allowable voltage swings before distortion occurs. Transistors become saturated more easily since the gate voltage must be closer to the drain voltage. The amount of gate-overdrive is limited by the reduced power-supply-voltage available. Thus distortion caused by linear transistors entering the saturated region are more common as power-supply voltages are reduced.

Filter Stage Using MOS Transistors—FIG. 1

FIG. 1A shows a prior-art filter stage using MOS transistors. Op amp 10 is a differential amplifier constructed from CMOS transistors. The outputs Von and Vop are fed back to inputs Vgp, Vgn through capacitors 18, 28. A difference in voltages on the Vgp, Vgn inputs are amplified by op amp 10 to produce output voltages Von, Vop.

External inputs Vip, Vin are applied to the filter stage and first pass through resistor network before being applied to op-amp inputs Vgp, Vgn. Rather than use a single resistor, a fixed resistor and a tunable transistor are connected in series, while another tunable transistor shunts intermediate node Vxp or Vxn to a virtual ground Vcm.

The resistor network from Vip to Vgp includes fixed resistor 14 in series with transistor 12, with transistor 16 shunting the intermediate node Vxp to a common-mode voltage Vcm, which is a virtual ground. The second resistor network from Vin to Vgn has fixed resistor 24 in series with transistor 22, with transistor 26 shunting the intermediate node Vxn to virtual-ground Vcm.

The equivalent resistance of each network is $$R_{eq} = R \cdot \left(1 + \frac{R_{m1}}{R_{m2}}\right) + R_{m1}$$

where M1 is transistor 12 or 22, M2 is transistor 16 or 26, and R is the fixed resistor 14 or 24.

N-channel MOS transistors 12, 16 allow the tuning of the effective resistance into input Vgp, while n-channel transistors 22, 26 tune the effective resistance to input Vgn. Control voltages Vc+ and Vc− can be adjusted to control the equivalent resistance by changing the gate voltages of transistors 12, 22 and 16, 26 respectively. These adjustments can occur while the filter is operating, since small adjustments in gate voltages Vc+, Vc− do not introduce glitches into the signal paths. If capacitors 18, 28 were tuned, the filtering operation must be halted since glitches can be introduced when the capacitance is changed by adding or removing capacitors in parallel. Since the major cause of the corner frequency shifting of the filter is the temperature variation, the prior art tunes the resistor to change corner frequency, which provides enough tuning range to cover the operation temperature range.

FIG. 1B shows that the equivalent resistor network includes fixed resistor 14 and variable resistances 32, 34, which are provided by transistors 12, 16. Changing the gate voltages Vc+, Vc− to transistors 12, 22, 16, 26 alters the resistance of resistances 32, 34, thus altering the equivalent resistance of the resistor network. The resistance values may be adjusted to tune the corner frequency of a filter that includes several instances of the filter stage. See Banu and Tsividis, "An elliptical continuous-time CMOS filter with on-chip automatic tuning", IEEE JSSC, vol SC-20, No. 6, pp 1114–1121 (December 1985).

Several of the filter stages of FIG. 1A may be connected together with some modifications to form a multi-stage ladder filter. See Moon and Song, "Design of a low-distortion 22-kHz fifth-order Bessel filter", IEEE JSSC, vol SC-28, No. 12, pp 1254–1264 (December 1993). The resistor network of FIG. 1B is modified for some of the filter stages. While FIG. 1B is a "single-resistor" network, a 2-resistor network and a 3-resistor network may be constructed by adding input resistors. These 2- and 3-resistor networks are used for the intermediate and first stages of the ladder filter. The 1-resistor network is used for a simple integrator.

FIG. 1C shows a 2-resistor network. The two resistors are resistors 14 and 36, which connect two inputs V1, V2 to intermediate node Vx. Variable resistance 32 connects node Vx to op-amp input Vg, while variable resistance 36 shunts intermediate node Vx to ground.

FIG. 1D shows a 3-resistor network. The three resistors are resistors 14, 36, and 38 which connect three inputs V1, V2, V3 to intermediate node Vx. Variable resistance 32 connects node Vx to op-amp input Vg, while variable resistance 36 shunts intermediate node Vx to ground.

While such resistor networks can be constructed with variable resistors implemented as MOS transistors biased in the linear region, if the inputs both shift in voltage (a common-mode change), the transistors may no longer remain in the linear region. Instead, the transistors enter the saturation region causing the transistors to no longer behave as linear resistors. Distortions then occur. The linearity of the filter is therefore limited to the common-mode range that keeps the transistors in the linear region.

As power-supply voltages are reduced, the common-mode range can be severely limited. When p-channel transistors are used as the input devices in the op-amp, the input voltages Vgp, Vgn must be less than Vcc/2, or 1.5 volts for a 3-volt supply. The gate-to-source and gate-to-drain voltages of transistors 12, 22 must be designed as large as possible to prevent saturation and improve linearity. However, with a maximum gate voltage of only 3 volts, saturation may not easily be prevented. The gate (control) voltage may not be able to be changed sufficiently for compensation without also causing the transistors to become saturated. Also, the voltage swing of intermediate node Vx must be limited, since high swings up in voltage could cause transistors 12, 22 to become saturated.

What is desired is a highly-linear ladder filter. It is desired to use transistors as variable resistors in resistor networks in the filter. It is desired to keep the transistors in the linear region of operation, even when a reduced power supply is used. A highly-linear filter for 3-volt power supplies is desired. It is desired to adjust resistance during filter operation, but to signal a halt to filtering to allow capacitance adjustment when resistance adjustments are no longer sufficient to compensate for condition changes. A multi-stage ladder filter that operates continuously using adjustable resistor networks is desirable.

SUMMARY OF THE INVENTION

A semi-continuous multi-stage filter has a series of differential filter stages connected in series and with feedback connections from later filter stages in the series to earlier filter stages in the series. Each filter stage includes a differential amplifier with a pair of amp inputs and a pair of amp outputs. The differential amplifier amplifies a voltage difference across the pair of amp inputs to generate the pair of amp outputs.

A pair of variable capacitors connect the amp outputs to the amp inputs as feedback within the filter stage. The variable capacitors adjust a feedback capacitance in response to capacitor-select signals received.

A pair of resistor networks, each has one or more stage-input resistors for connecting a series input from a previous filter stage or a feedback input from a later filter stage to an intermediate node. The stage-input resistors are resistors with resistances that do not vary substantially except with temperature. A connecting resistor is coupled to connect the intermediate node to one of the pair of amp inputs. The connecting resistor is a fixed resistor with a resistance that does not vary substantially except with temperature.

A pulldown transistor couples the intermediate node to a ground. The pulldown transistor producing a pulldown resistance from the intermediate node to the ground that varies substantially with a control voltage applied to a gate of the pulldown transistor. The control voltage is continuously adjusted for temperature changes to adjust a corner frequency of the multi-stage filter by adjusting the pulldown resistance in the resistor network. The feedback capacitance is adjusted by the capacitor-select signals during system initialization to compensate for manufacturing-process variations and an initial temperature. Thus pulldown resistance is adjusted continuously while feedback capacitance is adjusted initially.

In further aspects of the invention an analog control loop generates the control voltage. The analog control loop includes a voltage-controlled oscillator (VCO) and a phase detector. The phase detector generates the control voltage, and the control voltage controls an oscillation frequency of the VCO. The phase detector adjusts the control voltage to compensate for variations in the oscillation frequency caused by temperature variations.

A digital control loop generates the capacitor-select signals to the variable capacitors. The capacitor-select signals are also coupled to the VCO to vary the oscillation frequency in response to changes in the capacitor-select signals. Thus the analog control loop directly adjusts the control voltage to vary the pulldown resistance, while the digital control loop directly varies the feedback capacitance and indirectly varies the control voltage through the VCO.

In still further aspects the digital control loop further has a voltage comparator that receives the control voltage from the analog control loop. It generates a calibration signal to activate the digital control loop when the control voltage drifts outside a voltage window around a reference voltage. An effective resistance of the resistor network varies with the control voltage applied to the pulldown transistor connected to the intermediate node.

DETAILED DESCRIPTION

The present invention relates to an improvement in continuous-time filters. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that the linear transistor connected between the intermediate node and the op-amp input is the cause of distortions. Linearity is improved when this transistor is replaced by a fixed resistor, such as a polysilicon resistor. Tuning can still be accomplished with the transistor shunting the intermediate node to ground. The source of this transistor can be connected to ground to increase the gate-to source voltage, reducing the likelihood of the transistor becoming saturated. The intermediate node can be pulled down in voltage by this shunting transistor, reducing the voltage applied to the op-amp input.

Using just one tunable transistor reduces the tuning range of the resistor network. To allow a full range of compensation, the inventor uses two tuning circuits: the resistor tuning operates continuously while the filter is operational, while capacitor tuning occurs when the filter is halted. The resistor tuning circuit includes a limit detector that activates the capacitor tuner when the resistor tuning is not sufficient to compensate.

Once resistor tuning is not able to fully compensate, the filter is halted for a calibration cycle. The capacitor values are adjusted by digital successive approximation.

Capacitors are tuned using a digital control loop, while the resistors are tuned with an analog control loop. The digital control loop uses the control voltage generated by the analog loop to adjust the capacitors. Thus the digital and analog control loops are tightly connected.

Resistor Networks With One Variable Resistor—FIGS. 2

Figure 2A:
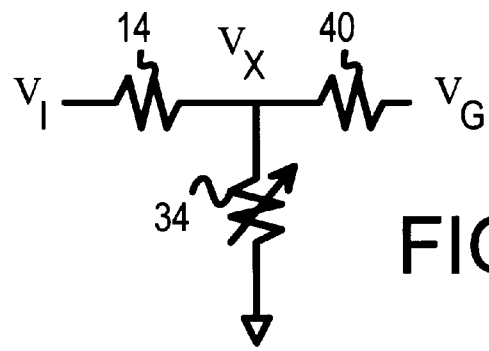
FIGS. 2A–D show resistor networks with a fixed resistor to the op-amp input using just one variable resistor.

FIGS. 2A–D show resistor networks with a fixed resistor to the op-amp input using just one variable resistor. Linearity is improved when fewer transistors are used since fewer devices can become saturated and cause distortion. Especially critical is the resistor to the op-amp input. FIG. 2A shows that fixed resistor 40 connects intermediate node Vx to op-amp input Vg. Input fixed-resistor 14 connects the input Vi to intermediate node Vx. The only variable resistor is variable resistor 34 that connects intermediate node Vx to ground. Fixed resistors 14, 40 are implemented as polysilicon resistors while variable resistor 34 is implemented as a transistor biased in the linear region.

Figure 1A:
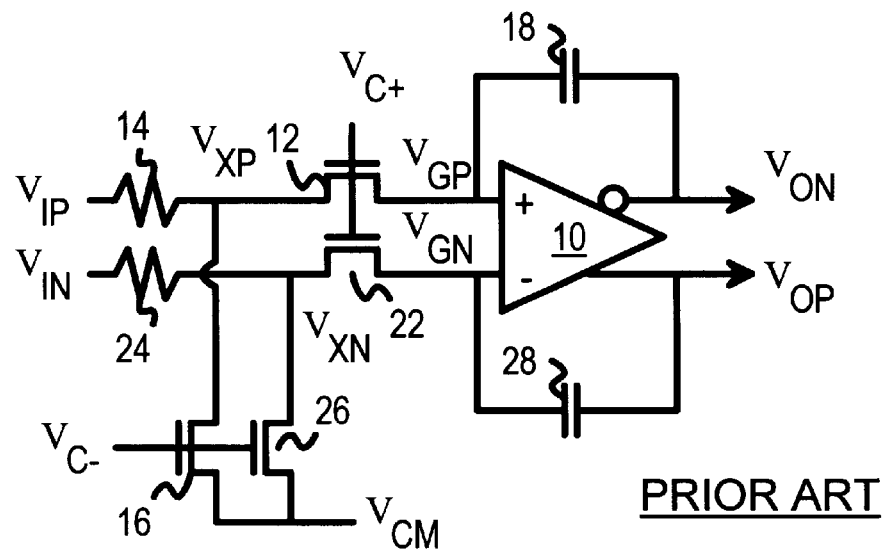
FIG. 1A shows a prior-art filter stage using MOS transistors.
Figure 1B:
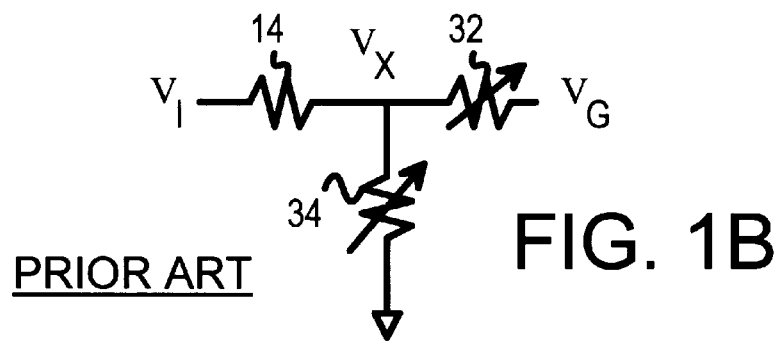
FIG. 1B shows that the equivalent resistor network includes fixed resistor 14 and variable resistances 32, 34, which are provided by transistors 12, 16.
Figure 1C:
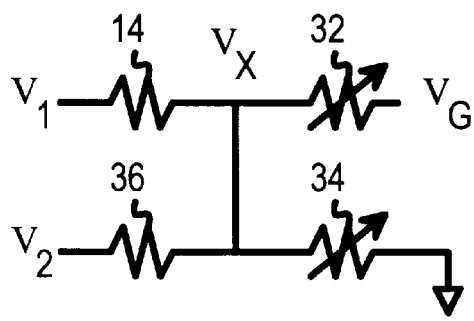
FIG. 1C shows a 2-resistor network.
Figure 1D:
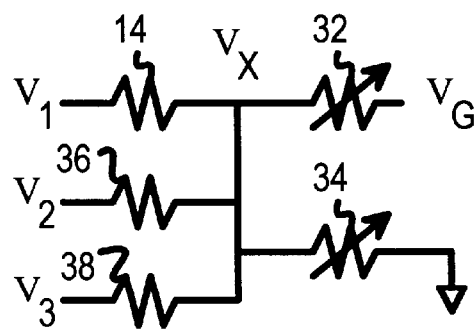
FIG. 1D shows a 3-resistor network.

Since polysilicon resistors are true resistors, distortion can only occur from variable resistor 34. Since this device is connected to ground rather than directly to the op-amp input, and distortions it causes are less severe than distortions caused by a transistor connected directly to the op-amp input, such as transistor 12 of FIG. 1A.

The input Vi is about 1.5 volts, half of the 3-volt Vcc power supply. Input Vi is produced by the output of other op amps, which typically output Vcc/2. Fixed resistor 14 drops the voltage of intermediate node Vx to 0.6 to 1.0 volt. Since most of the current is shunted to ground through variable resistor 34, little or no current flows through fixed resistor 40. The op-amp input node Vg is thus also at 0.6 to 1.0 volt.

Grounded transistor 42 effectively shifts the input voltage from 1.5 volts down to 0.6 to 1.0 volt. This is an ideal voltage for an op amp with PMOS input transistors.

Figure 2B:
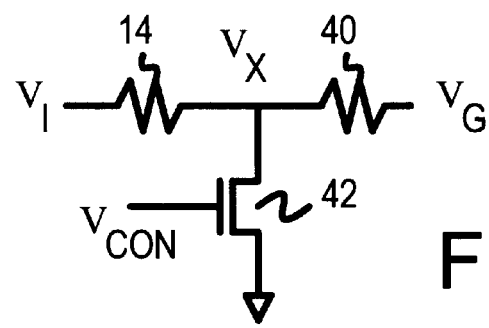

FIG. 2B shows that the variable resistor to ground is implemented as grounded transistor 42. The gate of grounded transistor 42 is connected to control voltage Vcon. If Vcon is kept at least a threshold above intermediate node Vx, then grounded transistor 42 remains in the linear region of operation. Distortion only occurs when the control voltage Vcon falls below about 1.5 volts.

Figure 2C:
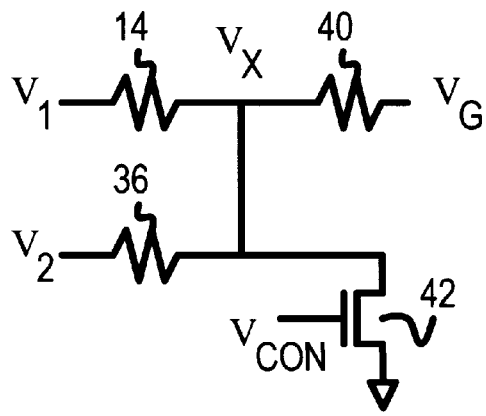

FIG. 2C shows a "2-resistor" equivalent resistor network. The 2 inputs V1, V2 are connected to intermediate node Vx by fixed resistors 14, 36. Series resistor 40 connects the intermediate node Vx to op-amp input Vg, while grounded transistor 42 shunts the current from Vx to ground. The resistor network is tuned by adjusting Vcon in the range of 3.0 to 1.5 volts. In this range of inputs, grounded transistor 42 is in the linear region, acting as a variable resistor.

Figure 2D:
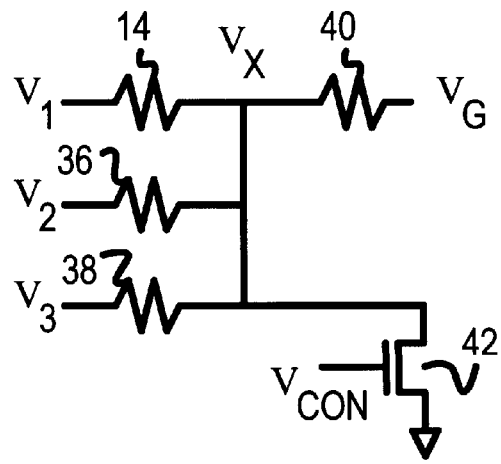

FIG. 2D shows a "3-resistor" equivalent resistor network. The 3 inputs V1, V2, V3 are connected to intermediate node Vx by fixed resistors 14, 36, 38. Series resistor 40 connects the intermediate node Vx to op-amp input Vg, while grounded transistor 42 shunts the current from Vx to ground. The resistor network is tuned by Vcon, which controls grounded transistor 42. The voltages of intermediate node Vx and op-amp input Vg is still in the range of 0.6 to 1.0 volt.

The resistor values of a 2-resistor input resistor network are determined by the equation.

$$\frac{R_{eq1}}{R_{eq2}} = \frac{R_1\left(1 + \frac{R_{m1}}{R_2} + \frac{R_{m1}}{R_{m2}}\right) + R_{m1}}{R_2\left(1 + \frac{R_{m1}}{R_1} + \frac{R_{m1}}{R_{m2}}\right) + R_{m1}} = \frac{R_1}{R_2},$$

where R1 and R2 are fixed resistors tied to two inputs of the resistor network, Rm1 is the passive resistor connected to the input of op amp, Rm2 is the variable (tuning) resistor, and Req1 and Req2 are equivalent resistances implemented by the network. The relative values between R1, Rm1, Rm2 are determined by the signal swing ratio between one of the input nodes (with the second input node grounded) and the Vx intermediate node.

Similarly, the resistor values of a 3-resistor input case are determined by the equations:

$$\frac{R_{eq1}}{R_{eq2}} = \frac{R_1\left(1 + \frac{R_{m1}}{R_2} + \frac{R_{m1}}{R_3} + \frac{R_{m1}}{R_{m2}}\right) + R_{m1}}{R_2\left(1 + \frac{R_{m1}}{R_1} + \frac{R_{m1}}{R_3} + \frac{R_{m1}}{R_{m2}}\right) + R_{m1}} = \frac{R_1}{R_2},$$

$$\frac{R_{eq1}}{R_{eq3}} = \frac{R_1\left(1 + \frac{R_{m1}}{R_2} + \frac{R_{m1}}{R_3} + \frac{R_{m1}}{R_{m2}}\right) + R_{m1}}{R_3\left(1 + \frac{R_{m1}}{R_1} + \frac{R_{m1}}{R_2} + \frac{R_{m1}}{R_{m2}}\right) + R_{m1}} = \frac{R_1}{R_3}$$

Figure 3:
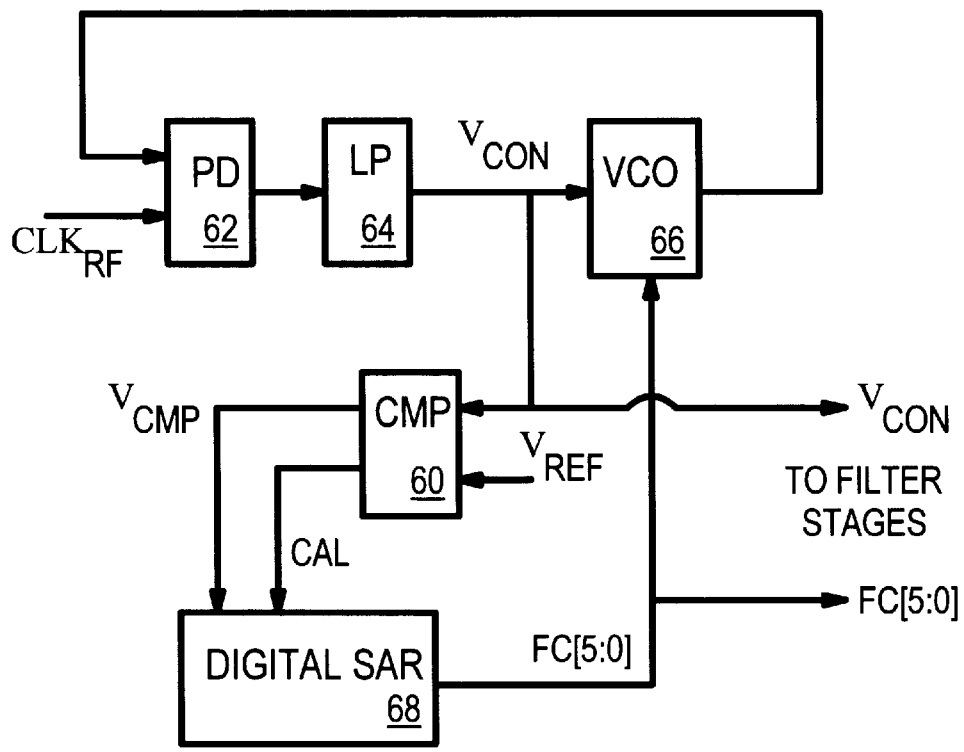
FIG. 3 is a tuning circuit with interdependent digital and analog control loops for controlling the capacitance and resistance in a filter.

Dual-Loop Tuning Circuit—FIG. 3

FIG. 3 is a tuning circuit with interdependent digital and analog control loops for controlling the capacitance and resistance in a filter. Phase detector 62, low-pass filter 64, and voltage-controlled oscillator VCO 66 together form an analog control loop. The input voltage to VCO 66 determines the frequency of the clock generated by VCO 66 and compared to a reference clock by phase detector 62.

A digital control loop includes voltage comparator 60, digital successive-approximation register SAR 68, and VCO 66, phase detector 62, and low-pass filter 64. Thus the digital control loop includes the analog control loop. This digital control loop adjusts the capacitance value indicated by capacitor-select signals FC[5:0].

As temperature changes the frequency of the clock from VCO 66, phase detector 62 adjusts the analog control voltage to compensate, bringing the VCO frequency back to normal. This control voltage input to VCO 66 is Vcon, the same control voltage applied to the gate of grounded transistor 42 (FIG. 2B) that acts as a variable resistor. The change in the control voltage is used to also adjust the variable resistors in the filter, adjusting the filter's corner frequency. Thus a voltage-controlled Phase-locked loop (PLL) is used to also control the filter's corner frequency.

The control voltage Vcon is also input to voltage comparator 60 for comparison with a reference voltage Vref. For larger temperature variations, the analog PLL control loop is not able to fully compensate. Voltage comparator 60 determines when Vcon is still too far from Vref and activates a calibration signal CAL when Vcon has drifted too far from Vref for the analog loop to fully compensate.

When calibration signal CAL is activated, the filtering is halted and a calibration cycle begins. Digital successive-approximation register SAR 68 is activated. Digital SAR 68 generates a 6-bit output FC[5:0] which determines the capacitance values by connecting various sizes of sub-capacitors in parallel. The value of FC[5:0] is adjusted by digital SAR 68, changing the capacitor value in VCO 66 as well as in the filter. As the capacitance inside VCO 66 changes, the VCO output frequency also changes. Phase detector 62 and low-pass filter 64 then adjusting control voltage Vcon.

The adjusted Vcon is fed back to voltage comparator 60. If Vcon is still not within the desired range, the digital SAR adjusts the FC[5:0] output, and the process repeated. All 6 bits of control code FC[5:0] are updated one-at-a-time, from MSB to LSB. At the end of the calibration process, Vcon is close to the middle of the tuning range. Once all 6 FC bits have been optimized, the calibration signal CAL is de-activated and the calibration cycle ends. The last FC[5:0] value from digital SAR 68 is used as the capacitor-selecting value until the next calibration cycle is activated.

During the digital calibration process FC[5] is set high and the other bits FC[4:0] are set low. When voltage comparator 60 determines that Vcon is in the top half of its allowed variation range, the corner frequency of the filter needs to be reduced. Vcmp from voltage comparator 60 is high and FC[5] remains high. Otherwise, FC[5] is reset low. This process is repeated for the following five least significant bits FC[4:0]. Once the digital calibration process is completed, the corner frequency of the filter is the same as the frequency of the reference clock and the control voltage Vcon is close to the middle of its variation range.

Calibration signal CAL is also activated during system initialization to set digital SAR 68 to the correct value before filtering begins. The digital control loop thus accounts for IC process variations, allowing the analog control loop to be used for smaller temperature variations. The control voltage Vcon is initialized to the middle of its desired range.

Figure 4:
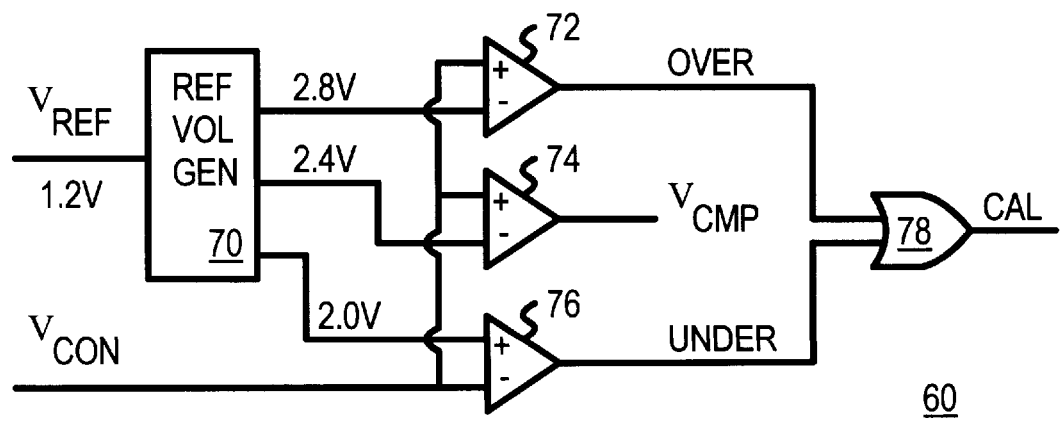
FIG. 4 is a diagram of the voltage comparator that triggers the digital control loop when the control voltage from the analog control loop is out of a desired range.

Voltage Comparator—FIG. 4

FIG. 4 is a diagram of the voltage comparator that triggers the digital control loop when the control voltage from the analog control loop is out of a desired range. A reference voltage Vref is generated at 1.2 volts by a band-gap reference. Voltage reference generator 70 contains a voltage divider that generates three voltages from the 1.2-volt Vref input. Voltages of 2.8, 2.4, and 2.0 are output by voltage reference generator 70.

Comparator 72 compares the 2.8-volt upper output from voltage reference generator 70 to the control voltage Vcon, and outputs a high when Vcon is over the 2.8-volt high voltage. An over-limit signal OVER is activated by comparator 72. OR gate 78 then activates the calibration signal CAL since the control voltage is over the 2.8-volt upper limit.

Comparator 76 compares the control voltage Vcon to the 2.0-volt lower output from voltage reference generator 70, and outputs a high when Vcon is below the 2.0-volt lower voltage. An under-limit signal UNDER is activated by comparator 76. OR gate 78 then activates the calibration signal CAL since the control voltage is under the 2.0-volt lower limit.

The target voltage output from voltage reference generator 70 is the middle voltage, 2.4 volts. Comparator 74 compares the control voltage Vcon to the target 2.4 volt signal to generate compare voltage Vcmp. Compare voltage Vcmp is high when Vcon is over the target, but low when Vcon is below the target. The digital SAR uses Vcmp to decide when to set or clear FC bits during successive approximations. This allows the digital SAR to adjust the capacitance to the target at the center of the desired range, not just to within the desired range. Vcmp is used only during a calibration cycle; it is ignored when CAL is low.

Figure 5:
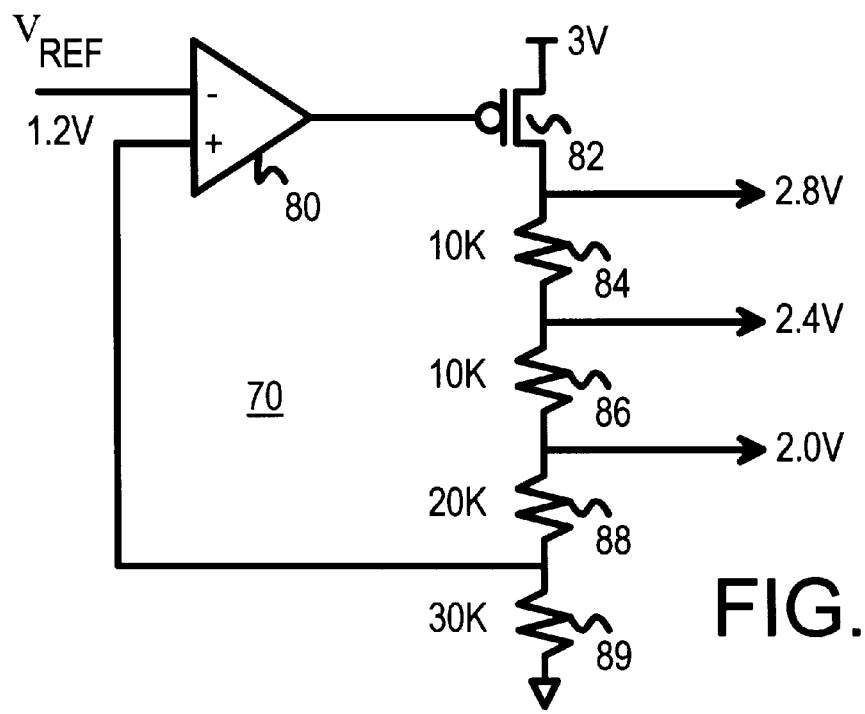
FIG. 5 is a diagram of the voltage reference generator.

Voltage Reference Generator—FIG. 5

FIG. 5 is a diagram of the voltage reference generator. A 1.2-volt reference voltage Vref is generated by a band-gap reference and applied to the inverting input of differential comparator 80. Voltage reference generator 70 contains a voltage divider with p-channel transistor 82 and resistors 84, 86, 88, 89. When a 3-volt power supply is used, the drain of transistor 82 is the 2.8-volt upper-limit voltage, while the lower terminal of resistor 84 is the 2.4-volt target voltage. The lower terminal of resistor 86 is the 2.0-volt lower-limit voltage.

The gate of p-channel transistor 82 is driven by the output of differential comparator 80. Feedback is provided from the node between resistors 88, 89 to the non-inverting input of differential comparator 80.

When process corners, temperature, or supply-voltage variations cause transistor 82 to increase its current drive, the 2.8, 2.4, and 2.0-volt outputs can rise above their nominal values. The feedback voltage is also raised by the additional current through bottom resistor 89. The higher feedback voltage applied to the non-inverting input causes differential comparator to increase the voltage of the output. This higher voltage reduces the gate-to-source (Vcc) voltage applied to p-channel transistor 82, reducing its current drive. This feedback causes the voltages to return to nominal values.

Figure 6:
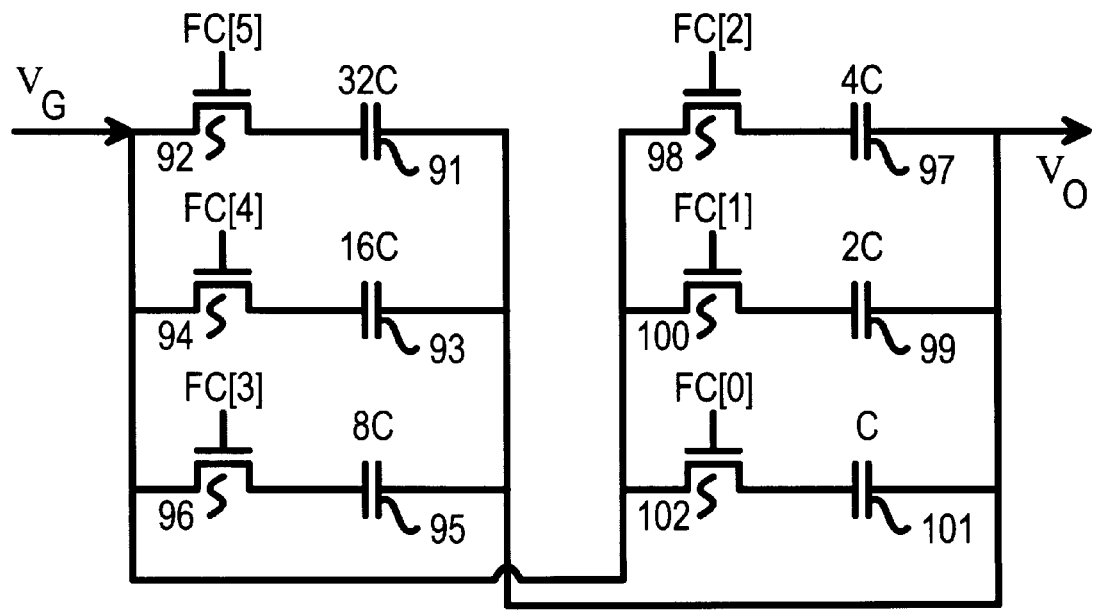
FIG. 6 is a diagram of a variable capacitor that is controlled by the capacitor-select signals generated by the digital control loop.

Variable Capacitors—FIG. 6

FIG. 6 is a diagram of a variable capacitor that is controlled by the capacitor-select signals generated by the digital control loop. The digital SAR outputs a 6-bit value FC[5:0] on a 6-bit capacitor-select bus. Each of the FC bits is applied to a different one of n-channel select transistors 92, 94, 96, 98, 100, 102 which are series-connected to capacitors 91, 93, 95, 97, 99, 101. Each transistor and capacitor in series are connected in parallel with other transistor-capacitor pairs between Vg and Vo. Vg is the input to an op amp in a filter stage, while Vo is an output from the same op amp. The capacitor acts as a feedback capacitor around the op amp.

Capacitors 91, 93, 95, 97, 99, 101 have successively smaller capacitance values of 32C, 16C, 8C, 4C, 2C, and C where C is a capacitance of smallest capacitor 101. The least-significant capacitor-select signal FC[0] controls transistor 102 which connects capacitor 101, increasing the overall capacitance by C. The most-significant capacitor-select signal FC[5] controls transistor 92 which connects largest capacitor 91, increasing the overall capacitance by 32C. Other transistors control intermediate capacitance values with intermediate-significant bits FC[4:1].

The total capacitance can vary from 0 to 63C, in increments of C. The 6-bit binary value FC[5:0] indicates the capacitance value. The digital successive-approximation register (SAR) first outputs 100000 to disconnect lower capacitors 93, 95, 97, 99, 101 but connect largest capacitor 91. When Vcon is in the upper control voltage range, Vcmp is high. The analog PLL is trying to increase the effective resistance. To bring Vcon toward the center of the control range, the capacitance must be increased. FC[5] remains high and FC[4] is set, engaging capacitor 93, which increases the total capacitance to 32+16 or 48C. When Vcmp is low, FC[5] is cleared and FC[4] is set, engaging capacitor 93, which sets the total capacitance to 16C. Successively lower FC bits are tested until the least-significant FC[0] is set or cleared. Then the digital SAR contains the best value of FC[5:0] to match the control voltage to the target voltage (2.4-volts). The compare voltage Vcmp is used to determine when to set to clear each successive FC bit.

Figure 7A:
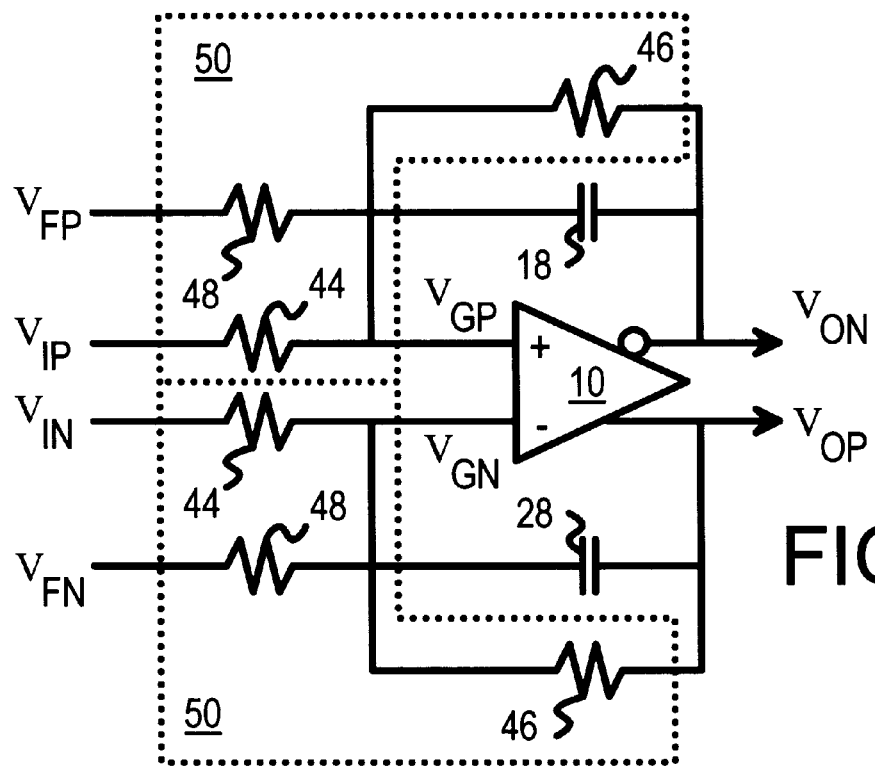
FIG. 7A is a diagram of a first stage of a ladder filter that includes 3-resistor networks on the inputs to the op amp.

First Stage with 3-Resistor Networks—FIG. 7A

FIG. 7A is a diagram of a first stage of a ladder filter that includes 3-resistor networks on the inputs to the op amp. Op amp 12 produces outputs Von and Vop which are fed back to op-amp inputs Vgp, Vgn through capacitors 18, 28. The capacitance of these capacitors are adjusted during calibration but remain constant during filter operation.

Two resistor networks 50 connect inputs Vin, Vip and feedback to op-amp inputs Vgp, Vgn. Each resistor network 50 is a 3-resistor network with first resistor 44 connecting input Vip (Vin) to op-amp input Vgp (Vgn), second resistor 48 connecting feedback Vfp (Vfn) from another filter stage to op-amp input Vgp (Vgn), and third resistor 46 connecting output Von (Vop) to op-amp input Vgp (Vgn) as internal resistive feedback. Resistor network 50 is implemented by four fixed resistors and one n-channel linear transistor to ground as shown in FIG. 2D. Resistors 44, 48, 46 are the equivalent 3-resistor network to the 4 resistors and one transistor of FIG. 2D.

Figure 7B:
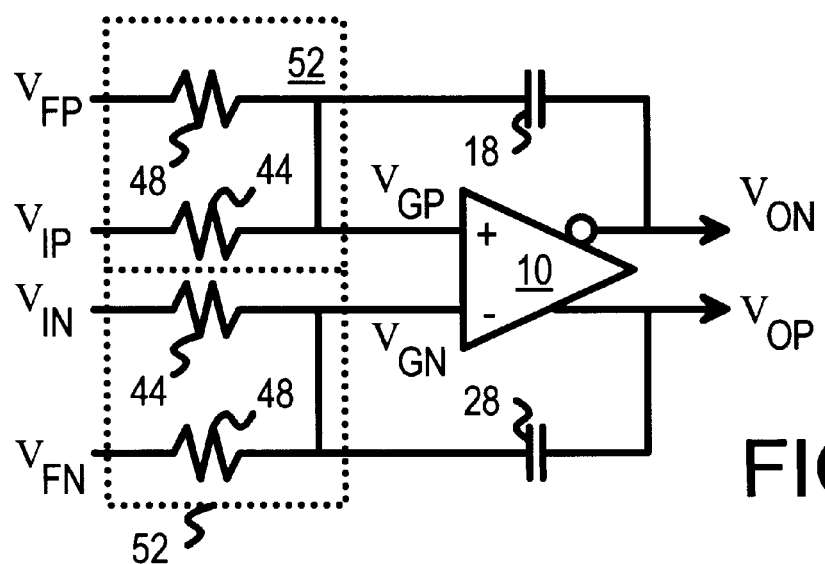
FIG. 7B is a diagram of an intermediate stage of a ladder filter that includes 2-resistor networks to the inputs to the op amp.

Intermediate Stage with 2-Resistor Networks—FIG. 7B

FIG. 7B is a diagram of an intermediate stage of a ladder filter that includes 2-resistor networks to the inputs to the op amp. Op amp 12 produces outputs Von and Vop which are fed back to op-amp inputs Vgp, Vgn through capacitors 18, 28. The capacitance of these capacitors are adjusted during calibration but remain constant during filter operation.

Two resistor networks 52 connect inputs Vin, Vip and feedback to op-amp inputs Vgp, Vgn. Each resistor network 52 is a 2-resistor network with first resistor 44 connecting input Vip (Vin) to op-amp input Vgp (Vgn) and second resistor 48 connecting feedback Vfp (Vfn) from another filter stage to op-amp input Vgp (Vgn). Resistor network 52 is implemented by three fixed resistors and one n-channel linear transistor to ground as shown in FIG. 2C. Resistors 44, 48 are the equivalent 2-resistor network to the 3 resistors and one transistor of FIG. 2C.

Figure 7C:
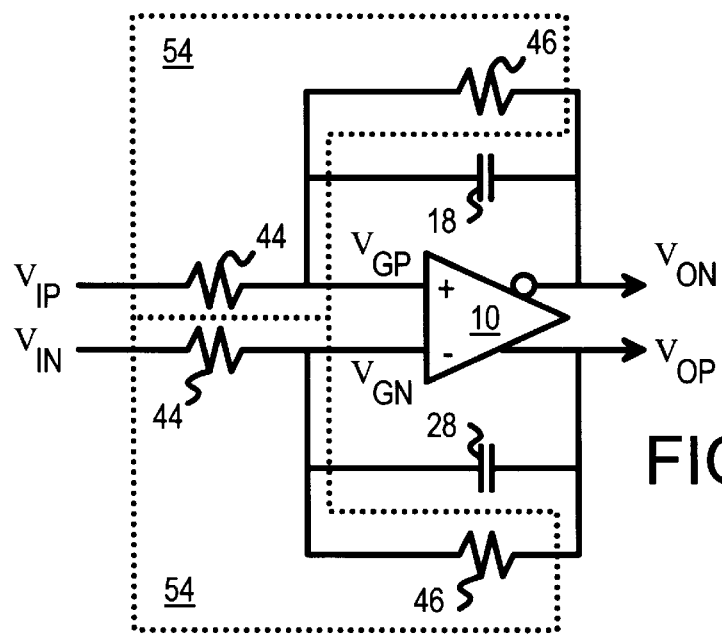
FIG. 7C is a diagram of a last stage of a ladder filter using 2-resistor networks to the inputs to the op amp.

Last Stage with 2-Resistor Networks—FIG. 7C

FIG. 7C is a diagram of a last stage of a ladder filter using 2-resistor networks to the inputs to the op amp. Op amp 12 produces outputs Von and Vop which are fed back to op-amp inputs Vgp, Vgn through capacitors 18, 28, which are adjusted during calibration but remain constant during filter operation.

Two resistor networks 54 connect inputs Vin, Vip and feedback to op-amp inputs Vgp, Vgn. Each resistor network 54 is a 2-resistor network with first resistor 44 connecting input Vip (Vin) to op-amp input Vgp (Vgn) and feedback resistor 46 connecting output Von (Vop) to op-amp input Vgp (Vgn) as internal resistive feedback. Resistor network 54 is also implemented by three fixed resistors and one n-channel linear transistor to ground as shown in FIG. 2C. Resistors 44, 48 are the equivalent 2-resistor network to the 3 resistors and one transistor of FIG. 2C.

Figure 8:
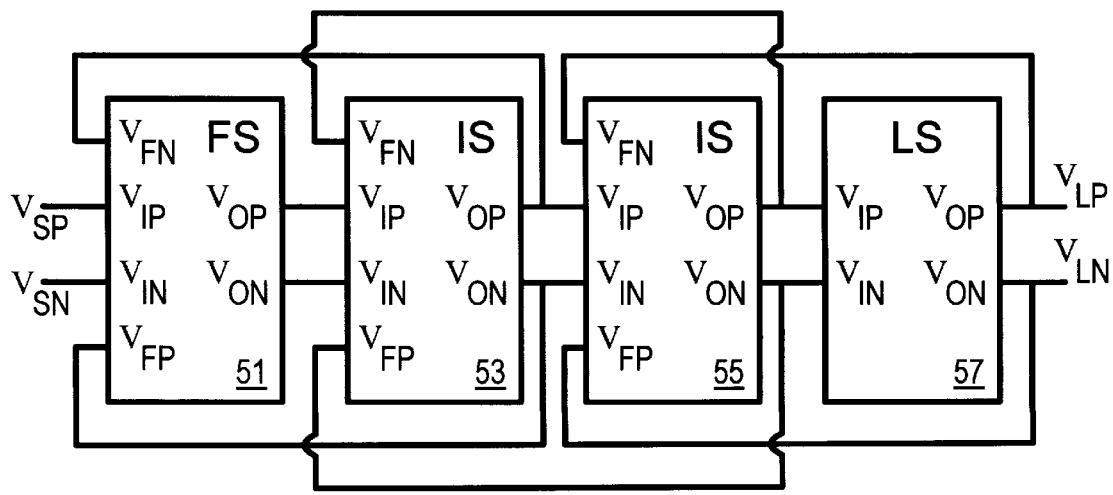
FIG. 8 is a block diagram of a ladder filter.

Ladder Filter—FIG. 8

FIG. 8 is a block diagram of a ladder filter. A 4-stage filter is shown, although other filter lengths may be constructed. First stage 51, shown in FIG. 7A, receives the filter inputs Vsp, Vsn on its Vip, Vin inputs to the 3-resistor networks. The feedback inputs Vfn, Vfp are driven by the reversed Vop, Von outputs from second stage 53, an intermediate stage as shown in FIG. 7B.

The Vop, Von outputs from first stage 51 drive the Vip, Vin inputs to second stage 53. The feedback inputs Vfn, Vfp are driven by the reversed Vop, Von outputs from third stage 55, which is also intermediate stage as shown in FIG. 7B. The Vop, Von outputs from second stage 53 drive the Vip, Vin inputs to third stage 55. The feedback inputs Vfn, Vfp of third stage 55 are driven by the reversed Vop, Von outputs from last stage 57.

Last stage 57 is a last stage as shown in FIG. 7C. It includes internal feedback using the 2-resistor networks. The Vop, Von outputs of last stage 57 are the filter's final outputs, Vlp, Vln.

Tuning of the equivalent resistance of the resistor networks in each stage 51, 53, 55, 57 is provided by a control voltage Vcon which is applied to the gate of the grounding n-channel transistor in each resistor network. Vcon is adjusted by the analog control loop continuously as the filter is operating and processing data.

Tuning of the feedback capacitors in each filter stage 51, 53, 55, 57 is activated during a calibration cycle that is triggered when Vcon drifts out of the desired range. The normal filter operation is halted so that user data is not corrupted by glitches that occur as parallel capacitors are added or removed. Calibration sets the capacitance values so that the resistor tuning voltage is in the middle of the tuning range.

ADVANTAGES OF THE INVENTION

A highly-linear ladder filter uses transistors as variable resistors in resistor networks in the filter. The transistors are kept in the linear region of operation, even when a reduced power supply is used. The highly-linear filter is thus ideal for 3-volt power supplies. Resistance is adjusted continuously during filter operation, but a calibration signal is generated to halt filtering to allow capacitance adjustment when resistance adjustments are no longer sufficient to compensate for condition changes. The multi-stage ladder filter operates continuously using adjustable resistor networks with capacitor calibration providing a wider range of adjustment when needed.

The variable resistor shunts an internal node to ground, allowing fixed resistors to be used in series between the input and op-amp input. The location of the variable resistor helps to automatically offset any non-linearity. As the control voltage Vcon is raised, the resistance of grounded transistor 42 (FIG. 2B) is reduced, and it operates more deeply in the linear range. When Vcon is lowered, the resistance of grounded transistor 42 increases, and it approaches the saturated region. Since the transition between the linear and saturated regions of transistor operation is gradual, some non-linearity may occur at the edge of the linear region. However, the higher resistance of grounded transistor 42 means that less A.C. current flows through it and thus the magnitude of the distortion is reduced. The opposite behavior would be true of a variable resistor directly connected to the op-amp input. Thus the location of the variable resistor helps to automatically offset any non-linearity.

Since polysilicon resistors are true resistors, distortion can only occur from variable resistor 34. Since this device is connected to ground rather than directly to the op-amp input, any distortions it causes are less severe than distortions caused by a transistor connected directly to the op-amp input, such as transistor 12 of FIG. 1A.

The digital SAR uses Vcmp to decide when to set or clear FC bits during successive approximations. This allows the digital SAR to adjust the capacitance to the target at the center of the desired range, not just to within the desired range. The advantage of adjusting Vcon to the middle of the tuning range is that the filter may have the maximum temperature tuning capability, allowing the temperature to up or down.

ALTERNATE EMBODIMENTS

Several other embodiments are contemplated by the inventor. For example various additions or substitutions can be made to the circuits, and the resistor networks can be used in other kinds of filters or circuits. The reduced power supply can be 3.0 volts, 3.3 volts, or other reduced voltages. Other transistor technology may be used for the MOS transistors. When using an op-amp with NMOS inputs, the variable resistor may be connected to power rather than ground. Fixed resistors are preferably constructed from polysilicon, but may also be constructed from diffusion regions or special resistive materials. PMOS transistors can be used as the variable resistor with the source tied to power, but power-supply noise may be greater than ground noise.

The control voltage Vcon could be derived from the VCO control voltage or buffered or level-shifted. The digital calibration-start signal CAL can also be generated by other control circuits or at system initiation to start digital calibration process. Other weighting besides binary-exponential can be used for the capacitors in parallel that are selected by the digital SAR.

The term continuous has been used to describe resistance adjustments, which continue while the digital control loop adjusts the capacitance during calibration. Of course, filtering of user data is semi-continuous since it must be halted during calibration, but filtering continues during resistance adjustments. The digital SAR can adjust the FC value under control of control logic, firmware, or a software routine that reads the voltage-compare result and writes updated FC values to the SAR register. Fixed resistors have a temperature variation described by a temperature coefficient, but do not vary substantially with power-supply voltage or the voltages applied across the resistor. Variable resistors have substantially varying resistances that vary in response to an applied control voltage.

The capacitance in the VCO adjusted by the digital control loop's digital SAR can be one ore more variable capacitors on one or more of the outputs of a series of inverting stages in a ring oscillator. The capacitor may affect the VCO frequency by increasing or decreasing one or more R-C delays in the ring oscillator. The control voltage may also adjust the R-C value by increasing or decreasing resistance through a transistor that has Vcon applied to its gate. Vcon can also be used to limit output current in one or more stages of the oscillator, such as by being applied to a tail transistor in a differential stage. Many other variations are possible.

Another application of this 3V tunable resistor network is for an AGC (Automatic Gain Control) that requires a variable resistor (used as V to I) and a fixed resistor (used as I to V) to set the gain. The traditional approach is to use a fixed resistor and a current-scaling circuit (implemented by four cross-coupled transistors) as variable resistor. This approach may have a problem handling large signals under a 3V power supply.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A highly-linear ladder filter that adjusts resistance comprising:

a plurality of filter stages, each filter stage having:

an op amp with a pair of op-amp inputs, for amplifying a voltage difference between the pair of op-amp inputs to generate op-amp outputs;

a pair of feedback capacitors, each feedback capacitor connecting an op-amp output to an op-amp input;

a pair of resistor networks, each resistor network connecting a stage input to an op-amp input with an equivalent resistance, the equivalent resistance being continuously adjusted by a control voltage;

wherein each resistor network includes:

a first fixed resistor, connecting the stage input to an intermediate node;

a fixed input resistor, connecting the intermediate node to the op-amp input;

a variable resistor, connecting the intermediate node to a ground node, the variable resistor having a resistance controlled by the control voltage;

wherein the variable resistor is a transistor biased in a linear region of operation by the control voltage applied to a gate of the transistor, wherein a drain of the transistor is connected to the intermediate node and wherein a source of the transistor is connected to the ground node: and an analog control loop for generating the control voltage whereby the control voltage adjusts channel resistance through the transistor and whereby linearity is improved by using the fixed input resistor connected to the op-amp input while the equivalent resistance of the resistor network is adjusted with the control voltage by the variable resistor to the ground node.

2. The highly-linear ladder filter of claim 1 further comprising:

a digital control loop, coupled to the analog control loop, for adjusting the control voltage to compensate for temperature changes too large to be adjusted solely by the analog control loop, whereby small adjustments are made by the analog control loop, but large adjustments are made by the digital control loop.

3. The highly-linear ladder filter of claim 2 wherein the analog control loop further comprises:

a phase detector, receiving a reference clock having a constant frequency, for comparing with a feedback clock;

a low-pass filter, coupled to the phase detector, for smoothing adjustments output by the phase detector to generate the control voltage; and a voltage-controlled oscillator (VCO), receiving the control voltage from the low-pass filter, for generating the feedback clock with a frequency controlled by the control voltage, whereby the analog control loop is a phase-locked loop (PLL).

4. The highly-linear ladder filter of claim 3 wherein the digital control loop is coupled to control a capacitance value of the feedback capacitors, the digital control loop adjusts the capacitance value of the feedback capacitors, the digital control loop also adjusting a capacitance value within the VCO to alter a frequency of the feedback clock, the phase detector adjusting the control voltage in response to feedback clock, whereby the digital control loop adjusts capacitance in the analog control loop to also adjust the control voltage.

5. The highly-linear ladder filter of claim 4 wherein the digital control loop further comprises:

a voltage comparator, receiving a reference voltage and outputting a calibration signal, for comparing the control voltage to a predetermined range of voltages, the voltage comparator activating the calibration signal when the control voltage is outside of the predetermined range of voltages;

a digital successive-approximation register SAR, coupled to the voltage comparator, for adjusting the capacitance value when the calibration signal is activated, the digital SAR adjusting the capacitance value until the control voltage is within the predetermined range of voltages, whereby the capacitance value is adjusted when the calibration signal is activated when the control voltage is outside of the predetermined range of voltages.

6. The highly-linear ladder filter of claim 5 wherein the digital SAR outputs the capacitance value on a select bus, the select bus controlling connection and disconnection of sub-capacitors in parallel, the select bus including most-significant signals for connecting sub-capacitors with largest capacitances and including least-significant signals for connecting sub-capacitors with smallest capacitances, wherein the digital SAR first tests connecting the largest capacitances before connecting the smallest capacitances, wherein the digital SAR successively connects larger then smaller capacitances until a capacitance value is selected causing the control voltage to fall closest to a target voltage within the predetermined range of voltages.

7. The highly-linear ladder filter of claim 6 wherein the select bus includes at least six lines for connecting at least six sub-capacitors to adjust capacitance.

8. The highly-linear ladder filter of claim 6 wherein filtering of user data is halted when the calibration signal is activated, but filtering is not halted but continues when the analog control loop adjusts the control voltage, whereby filtering continues for resistance changes but stops for capacitance changes.

9. The highly-linear ladder filter of claim 6 wherein the calibration signal is activated during system initialization, the digital control loop compensating for manufacturing-process variations and an initial temperature during system initialization.

10. The highly-linear ladder filter of claim 6 wherein the voltage comparator further comprises:

a voltage divider for generating from the reference voltage an upper-limit voltage, a lower-limit voltage, and a target voltage between the upper-limit voltage and the lower-limit voltage;

an upper comparator for comparing the control voltage to the upper-limit voltage and activating the calibration signal when the control voltage is above the upper-limit voltage;

a lower comparator for comparing the control voltage to the lower-limit voltage and activating the calibration signal when the control voltage is below the lower-limit voltage; and a target comparator for comparing the control voltage to the target voltage, the target comparator indicating to the digital SAR when the control voltage is above the target voltage;

wherein the digital SAR reduces the capacitance value during calibration when the target comparator indicates that the control voltage is above the target voltage, whereby the voltage comparator signals calibration when the control voltage is outside the predetermined range of voltages, the voltage comparator also signaling the digital SAR a direction of adjustment during calibration.

11. The highly-linear ladder filter of claim 10 wherein each resistor network further comprises:

a second fixed resistor, connecting a feedback input to the intermediate node, wherein the feedback input is connected to an op-amp output of another filter stage for intermediate stages not including a last stage, wherein the feedback input is connected to an op-amp output of the last stage filter stage when the resistor network is in the last stage, whereby 2-resistor-input networks are used for the intermediate and last stages.

12. The highly-linear ladder filter of claim 11 wherein for a first stage each resistor network further comprises:

a second fixed resistor, connecting a feedback input to the intermediate node, a third fixed resistor, connecting the op-amp output of the first stage to the intermediate node, wherein the feedback input is connected to an op-amp output of another filter stage, whereby 3-resistor-input networks are used for the first stage.

13. A semi-continuous multi-stage filter comprising:

a series of differential filter stages connected in series and with feedback connections from later filter stages in the series to earlier filter stages in the series;

wherein each filter stage includes:

a differential amplifier with a pair of amp inputs and a pair of amp outputs, wherein the differential amplifier amplifies a voltage difference across the pair of amp inputs to generate the pair of amp outputs;

a pair of variable capacitors for connecting the amp outputs to the amp inputs as feedback within the filter stage, the variable capacitors adjusting a feedback capacitance in response to capacitor-select signals received;

a pair of resistor networks, each resistor network having:
  one or more stage-input resistors for connecting a series input from a previous filter stage or a feedback input from a later filter stage to an intermediate node, the stage-input resistors being fixed resistors with resistances that do not vary substantially except with temperature;
  a connecting resistor, coupled to connect the intermediate node to one of the pair of amp inputs, the connecting resistor being a fixed resistor with a resistance that does not vary substantially except with temperature; and
  a pulldown transistor, coupling the intermediate node to a ground, the pulldown transistor producing a pulldown resistance from the intermediate node to the ground that varies substantially with a control voltage applied to a gate of the pulldown transistor;
wherein the control voltage is continuously adjusted for temperature changes to adjust a corner frequency of the multi-stage filter by adjusting the pulldown resistance in the resistor network;
wherein the feedback capacitance is adjusted by the capacitor-select signals during system initialization to compensate for manufacturing-process variations and an initial temperature;
an analog control loop for generating the control voltage, the analog control loop including a voltage-controlled oscillator (VCO) and a phase detector, the phase detector generating the control voltage and the control voltage controlling an oscillation frequency of the VCO, the phase detector adjusting the control voltage to compensate for variations in the oscillation frequency caused by temperature variations; and
a digital control loop for generating the capacitor-select signals to the variable capacitors, the capacitor-select signals also coupled to the VCO for varying the oscillation frequency in response to changes in the capacitor-select signals,
whereby pulldown resistance is adjusted continuously while feedback capacitance is adjusted initially and whereby the analog control loop directly adjusts the control voltage to vary the pulldown resistance, while the digital control loop directly varies the feedback capacitance and indirectly varies the control voltage through the VCO.

14. The semi-continuous multi-stage filter of claim 13 wherein the digital control loop further comprises:
a voltage comparator, receiving the control voltage from the analog control loop, for generating a calibration signal to activate the digital control loop when the control voltage drifts outside a voltage window around a reference voltage.

15. The semi-continuous multi-stage filter of claim 14 wherein an effective resistance of the resistor network varies with the control voltage applied to the pulldown transistor connected to the intermediate node,
whereby the pulldown transistor varies the effective resistance of the resistor networks applied to the amp inputs.

16. The semi-continuous multi-stage filter of claim 15 wherein the pulldown transistor is an n-channel complementary metal-oxide-semiconductor (CMOS) transistor, and wherein the stage-input resistors and the connecting resistor are polysilicon resistors.

17. The semi-continuous multi-stage filter of claim 16 wherein a common-mode voltage of the amp inputs is about 0.6 to 1.0 volt and wherein a power-supply voltage Vcc is about 3 volts;
wherein a common-mode voltage of the amp outputs is about Vcc/2,
whereby the common-mode voltage of the amp inputs is shifted down below Vcc/2 by the pulldown transistor.

18. A filter comprising:
a plurality of stage means, each stage means having:
  amplifier means for generating amp outputs from amp inputs;
  resistor network means, applied to each amp input, for generating an equivalent resistance between series and feedback inputs to the amp input, the equivalent resistance varying in response to control-voltage means, the resistor network means including:
    series fixed resistor means between each series input to a stage means and an intermediate node, for providing a fixed resistance to the intermediate node that does not vary with the control-voltage means;
    feedback fixed resistor means between each feedback input to a stage means and the intermediate node, for providing a fixed resistance to the intermediate node that does not vary with the control-voltage means;
    second fixed resistor means between the intermediate node and the amp input, for providing a fixed resistance from the intermediate node to the amp input that does not vary with the control-voltage means;
    transistor means, coupled to the intermediate node, for providing a variable resistance from the intermediate node, the variable resistance adjusting the equivalent resistance between the series input and the amp input, the variable resistance varying in response to the control-voltage means, the control-voltage means being applied to a gate of the transistor means;
  feedback capacitor means, coupled between the amp output and the amp input, for providing a variable capacitance;
analog control-loop means for generating the control-voltage means, the analog control-loop means including a voltage-controlled oscillator (VCO) for varying an oscillation frequency in response to the control-voltage means and phase-detect means for varying the control-voltage means in response to variations of the oscillation frequency from a target frequency; and
digital-control means for varying the variable capacitance during system initialization and when the control-voltage means is outside of a predetermined range,
whereby the equivalent resistance is varied by the analog control-loop means adjusting the transistor means while the variable capacitance is varied by the digital-control means.

* * * * *